United States Patent
Dunne et al.

(10) Patent No.: US 7,807,556 B2
(45) Date of Patent: Oct. 5, 2010

(54) METHOD FOR DOPING IMPURITIES

(75) Inventors: Greg Thomas Dunne, Rexford, NY (US); Jesse Berkley Tucker, Schenectady, NY (US); Stanislav Ivanovich Soloviev, Albany, NY (US); Zachary Matthew Stum, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 713 days.

(21) Appl. No.: 11/566,814

(22) Filed: Dec. 5, 2006

(65) Prior Publication Data
US 2008/0132047 A1 Jun. 5, 2008

(51) Int. Cl.
*H01L 21/22* (2006.01)
*H01L 21/38* (2006.01)
(52) U.S. Cl. .................. 438/558; 257/E21.468
(58) Field of Classification Search .......... 257/E21.468, 257/E21.466, E21.473; 438/562, 560, 558, 438/542, 369, 527
See application file for complete search history.

(56) References Cited

U.S. PATENT DOCUMENTS

| 4,490,192 | A | * | 12/1984 | Gupta et al. ............... 438/558 |
| 4,734,386 | A | | 3/1988 | Kubota et al. |
| 6,825,104 | B2 | | 11/2004 | Horzel et al. |
| 6,924,200 | B2 | | 8/2005 | Furukawa et al. |
| 2005/0181566 | A1 | | 8/2005 | Machida et al. |
| 2005/0184296 | A1 | | 8/2005 | Sudarshan et al. |
| 2006/0105554 | A1 | | 5/2006 | Inada |

FOREIGN PATENT DOCUMENTS

EP 0316940 A1 * 5/1989

* cited by examiner

*Primary Examiner*—Matthew C Landau
*Assistant Examiner*—Jessica Hall
(74) *Attorney, Agent, or Firm*—Ann M. Agosti

(57) ABSTRACT

A method for doping impurities into a device layer includes providing a carbonized dopant layer including one or more dopant impurities over a device layer and heat treating the carbonized dopant layer to thermally diffuse the dopant impurities into the device layer.

21 Claims, 7 Drawing Sheets

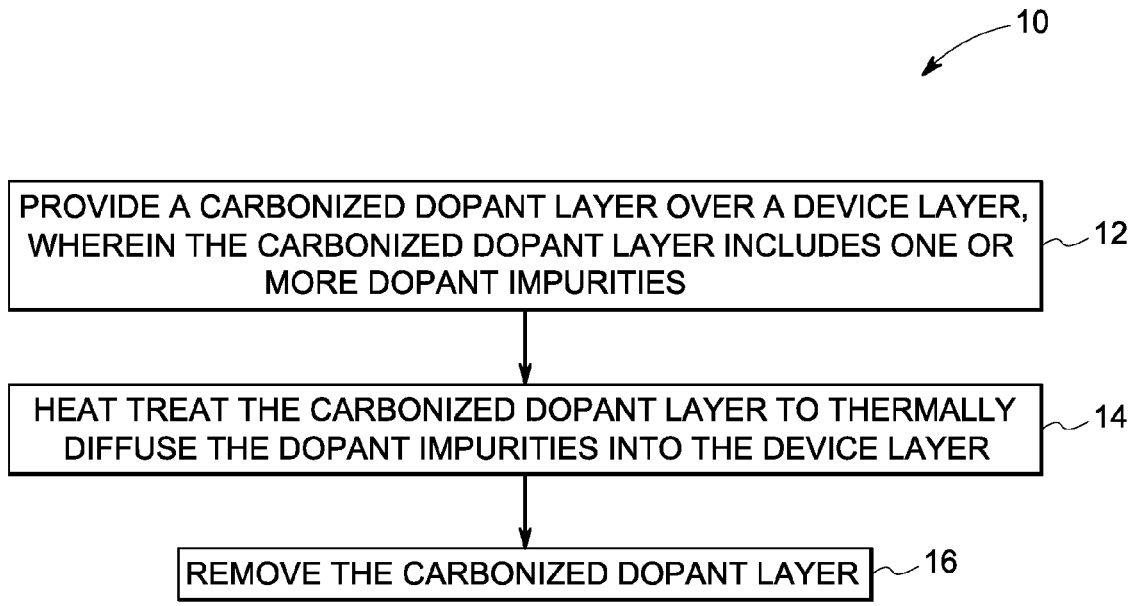

METHOD FOR DOPING IMPURITIES

BACKGROUND

The invention relates generally to a method for doping impurities into semiconductor device layers and more particularly, the invention relates to a solid phase diffusion method for doping impurities into semiconductor device layers.

Currently, doped areas in wafers are created in one of a few ways. In one method, a semiconductor layer is grown with the dopant impurity in the gas stream during epitaxial growth of the semiconductor layer. The wafer can then be patterned and etched leaving doped regions. Epitaxy is typically conformal and non-selective.

In another method, a pattern is made on a wafer or on top of an epitaxially grown layer. Impurities are then ion implanted by controlling the dose and power. Although ion implantation can be selectively performed, it often leaves a damaged matrix and requires a subsequent annealing process to embed the dopant impurity within the matrix.

A method for doping impurities without the drawbacks of the current techniques would therefore be desirable.

BRIEF DESCRIPTION

One embodiment of the present invention is a method for doping impurities into a device layer. The method includes providing a carbonized dopant layer over a device layer, wherein the carbonized dopant layer comprises one or more dopant impurities, and heat treating the carbonized dopant layer to thermally diffuse the dopant impurities into the device layer.

Another embodiment of the present invention is a method for doping impurities into a device layer with the method including disposing a carbon-based dopant material, wherein the carbon-based dopant material comprises one or more dopant impurities, carbonizing the carbon-based material to form a carbonized dopant layer, and heat treating the carbonized dopant layer to thermally diffuse the dopant impurities into the device layer.

Still another embodiment of the present invention is a method for fabricating a semiconductor device. The method includes providing a first carbonized dopant layer over a device layer, wherein the carbonized dopant layer includes one or more first dopant impurities, heat treating the first carbonized dopant layer to thermally diffuse the first dopant impurities into the device layer, removing the first carbonized dopant layer, providing a second carbonized dopant layer over the device layer subsequent to removal of the first carbonized dopant layer, wherein the second carbonized dopant layer comprises one or more second dopant impurities, and heat treating the second carbonized dopant layer to thermally diffuse the second dopant impurities into the device layer.

Yet another embodiment of the present invention is a method for fabricating a semiconductor device wherein the method includes providing a first patterned carbonized dopant layer over a device layer, wherein the carbonized dopant layer comprises one or more first type dopant impurities, providing a second carbonized dopant layer over the first patterned carbonized dopant layer and partly in contact with the device layer, wherein the second carbonized dopant layer comprises one or more second type dopant impurities different from the first type dopant impurities, and heat treating the first patterned carbonized dopant layer and second layer to thermally diffuse the first and second dopant impurities in a patterned device structure.

DRAWINGS

These and other features, aspects, and advantages of the present invention will become better understood when the following detailed description is read with reference to the accompanying drawings in which like characters represent like parts throughout the drawings, wherein:

FIG. 1 is a flow chart illustrating a method for diffusing impurities into a device layer in accordance with one embodiment of the present invention.

FIG. 2 is a flow chart illustrating a method for diffusing impurities into a device layer in accordance with one embodiment of the present invention.

DETAILED DESCRIPTION

Figure 3:
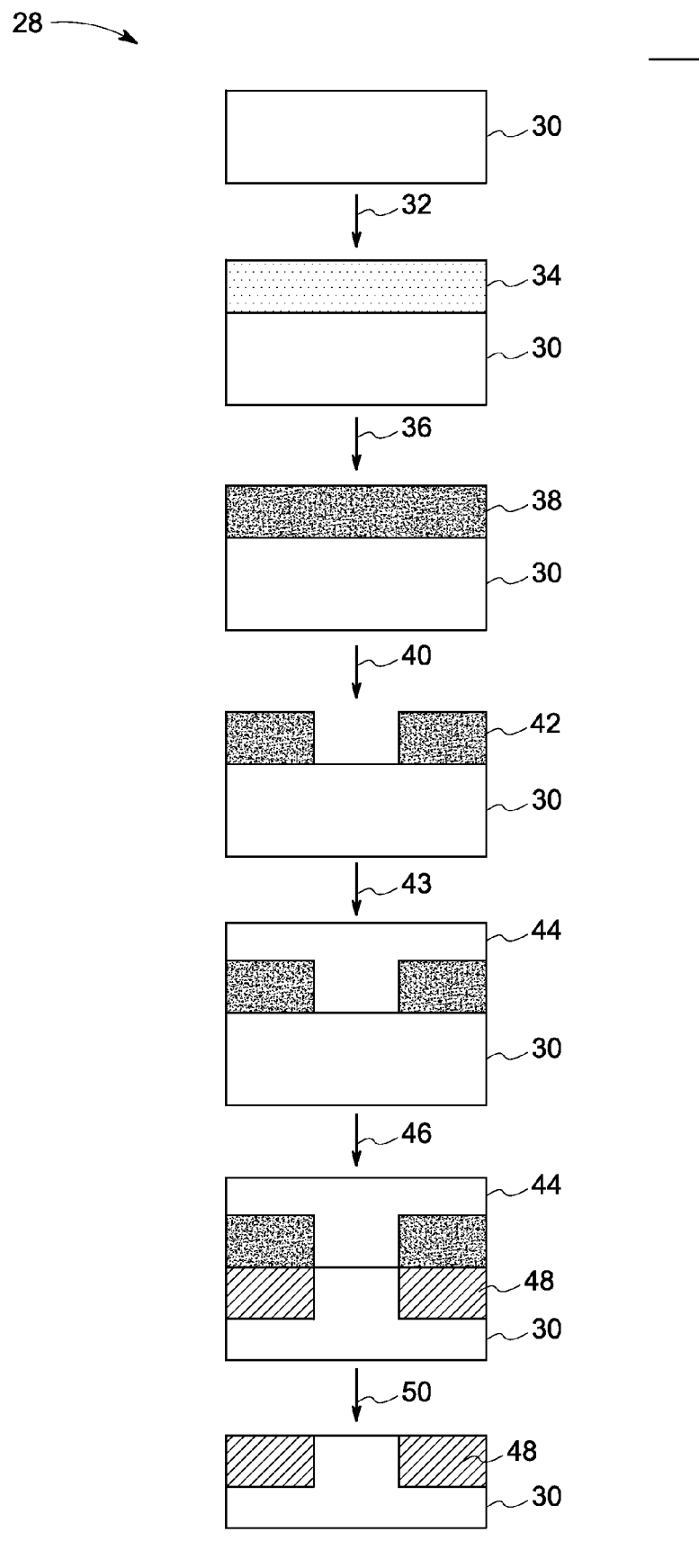
FIG. 3 is a schematic representation of a method for doping impurities into a device layer in accordance with one embodiment of the present invention.

Embodiments of the present invention include methods for doping impurities into device layers, particularly semiconductor device layers. As used herein, the term "device layer" refers to any layer in a device, for example, an active device layer or a substrate layer in a semiconductor device. The device layer may be semiconducting prior to the diffusion of impurities in accordance with one embodiment of the present invention. The layer may also be rendered semiconducting upon diffusion of impurities in accordance with another embodiment of the present invention.

One embodiment of the present invention is a method for doping impurities into a device layer using a carbonized dopant film including one or more impurities disposed over the device layer. A thermal diffusion process is used to diffuse the impurities into the device layer either conformally or selectively.

FIG. 1 is a flow chart illustrating a method 10 for doping impurities into a device layer in accordance with one embodiment of the present invention. In step 12, a carbonized dopant layer is provided over a device layer. The carbonized dopant layer includes one or more dopant impurities.

Non-limiting examples of dopant impurities include aluminum, boron, gallium, phosphorus, arsenic, antimony, and nitrogen. In one embodiment, the dopant impurities are acceptor type impurities such as boron. In another embodiment, the dopant impurities are donor type impurities such as for example, phosphorus. Examples of other dopant impurities include gallium, magnesium, arsenic, calcium, iron, antimony, nitrogen, silicon, vanadium and beryllium. In a further embodiment, the dopant impurities are magnetic dopants. Non-limiting example of magnetic dopants include iron, manganese and chromium. In another embodiment, the dopant impurities are optical dopants. Non-limiting examples of optical dopants include zinc and rare earth elements.

In one embodiment, the substrate or device layer is a silicon carbide layer. In another embodiment, the substrate or device layer is gallium nitride. Non-limiting examples of other substrate layer or device layer materials include silicon, aluminum nitride, indium nitride, and aluminum-gallium nitride.

In one embodiment, the step of providing a carbonized dopant layer includes disposing a carbon-based dopant material over a device layer and carbonizing the carbon-based material to form a carbonized dopant layer. In one embodiment, the carbon-based dopant material includes a photoresist material and one or more dopant materials (dopant impurities or source of dopant impurities). In one embodiment, the carbonized dopant layer includes a carbon material such as diamond or diamond like carbon.

The step of disposing a carbon-based dopant material over a device layer may include the step of coating or depositing the carbon-based dopant material. Non-limiting examples of methods for coating a device layer with a carbon-based dopant material include spin coating.

In one embodiment, the carbonization process involves heating at a temperature well above room temperature. For example, the carbon-based dopant material may be heated at a temperature in a range from about 500° C. to about 1500° C. to carbonize the material to form a carbonized dopant layer, wherein the dopant impurities are embedded in a matrix of carbon. In one example, the carbon-based dopant material is heated to a requisite temperature so as to drive out solvents to carbonize it to form a carbonized dopant layer.

In one embodiment of the present invention, a carbonized dopant layer may be deposited over a device layer by vapor depositing or co-sputtering. The carbonized dopant layer includes carbon and one or more dopant impurities. In one embodiment, the carbonized dopant layer includes a carbon material such as diamond or diamond like carbon.

The carbonized dopant layer is then heat treated to thermally diffuse the dopant impurities into the device layer 14. In a non-limiting example, the heat treatment step is an annealing step. In one embodiment, the annealing may be carried out at a temperature selected in a range from about 1000° C. to about 2500° C. In a further embodiment, the annealing may be carried out at a temperature selected in a range from about 1500° C. to about 2200° C. In one example, the time duration for the annealing process is about 10 minutes. The temperature and time duration of the heat treatment may be suitably selected to provide a desired level of thermal diffusion of dopants into the device layer.

In an alternate embodiment, the carbonized dopant layer is provided over the device layer by forming the carbonized dopant layer over a different substrate, removing the carbonized dopant layer from the substrate, and then disposing the carbonized dopant layer.

Regardless of the manner in which the carbonized dopant layer is applied, after the heat treatment the carbonized dopant layer is typically removed in step 16. In a non-limiting example, the carbonized layer is burnt or turned into ash in an oxygen environment and removed.

FIG. 2 is a flow chart illustrating a method 18 for doping impurities into a device layer in accordance with a more specific embodiment of the present invention. The flow chart illustrates the method for selectively doping dopant impurities into a device layer. After the step of providing a carbonized dopant layer 20, the carbonized dopant layer is patterned. In one example, a PECVD nitride (plasma enhanced chemical vapor deposition of silicon nitride) layer is deposited over the carbonized dopant layer. A photoresist layer is then deposited over the nitride layer and is patterned using photolithography techniques. This is followed by reactive ion etching of the nitride layer, followed by reactive ion etching of the carbonized dopant layer. In one example, a carbonized dopant layer is patterned after carbonization by using reactive ion etching of oxygen with a suitable mask such as $Si_3N_4$. In one embodiment, the nitride layer is deposited over the carbonized dopant layer to protect the carbonized dopant layer during the patterning and etching processes. The carbonized layer is then heat treated to thermally diffuse the dopant impurities into the device layer 22. The carbonized dopant layer is then removed in step 24.

FIG. 3 is a schematic representation of a process for doping impurities into a device layer in accordance with one embodiment of the present invention, which is a more specific variation of the embodiment of FIG. 2. The method 28 includes providing a device layer or substrate 30. In step 32, a coating 34 of the carbon-based dopant material is disposed over the device layer 30. In step 36, the carbon-based dopant material is carbonized to form the carbonized dopant layer 38. In step 40, the carbonized dopant material is patterned. In step 43, a protective layer of the photoresist material 44 is disposed over the patterned layer 42 before step 46, where the carbonized layer is heat treated to diffuse impurities in the device layer to form impurity doped regions 48. In step 50, the carbonized dopant layer and the protective layer are removed.

Figure 4:
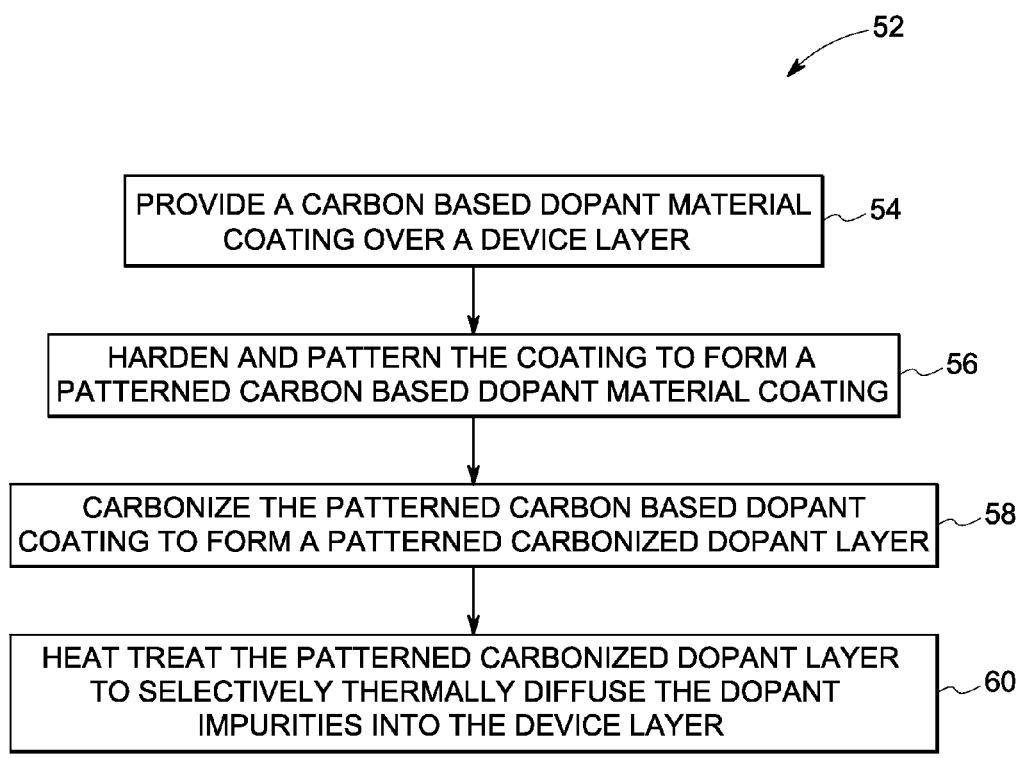
FIG. 4 is a flow chart illustrating a method for diffusing impurities into a device layer in accordance with one embodiment of the present invention.

An alternate embodiment to the method shown in FIG. 2 is a method 52 illustrated in the flow chart shown in FIG. 4 for doping impurities into a device layer in accordance with one embodiment of the present invention. In the embodiment of FIG. 4, the step of patterning occurs prior to the step of carbonization of the carbon-based dopant material. Following disposing a carbon-based dopant material coating over a device layer 54, the coating is hardened and patterned in step 56 using for example, conventional photolithography techniques. In a non-limiting example, the dopant material disposed over a substrate or device layer may be subjected to a soft bake, for example at temperature from about 90° C. to about 110° C. and then subjected to exposure through a photomask and development of the photoresist. This may be followed by a hard bake at about a temperature about 300° C. and an etch to finally pattern the carbon-based dopant material coating. This is followed by heating the dopant material to a higher temperature, for example at about 750° C., leading to carbonization of the dopant material. The carbonized layer is then heat treated to thermally diffuse the dopant impurities into the device layer 58. The carbonized dopant layer is then removed in step 60.

Figure 5:
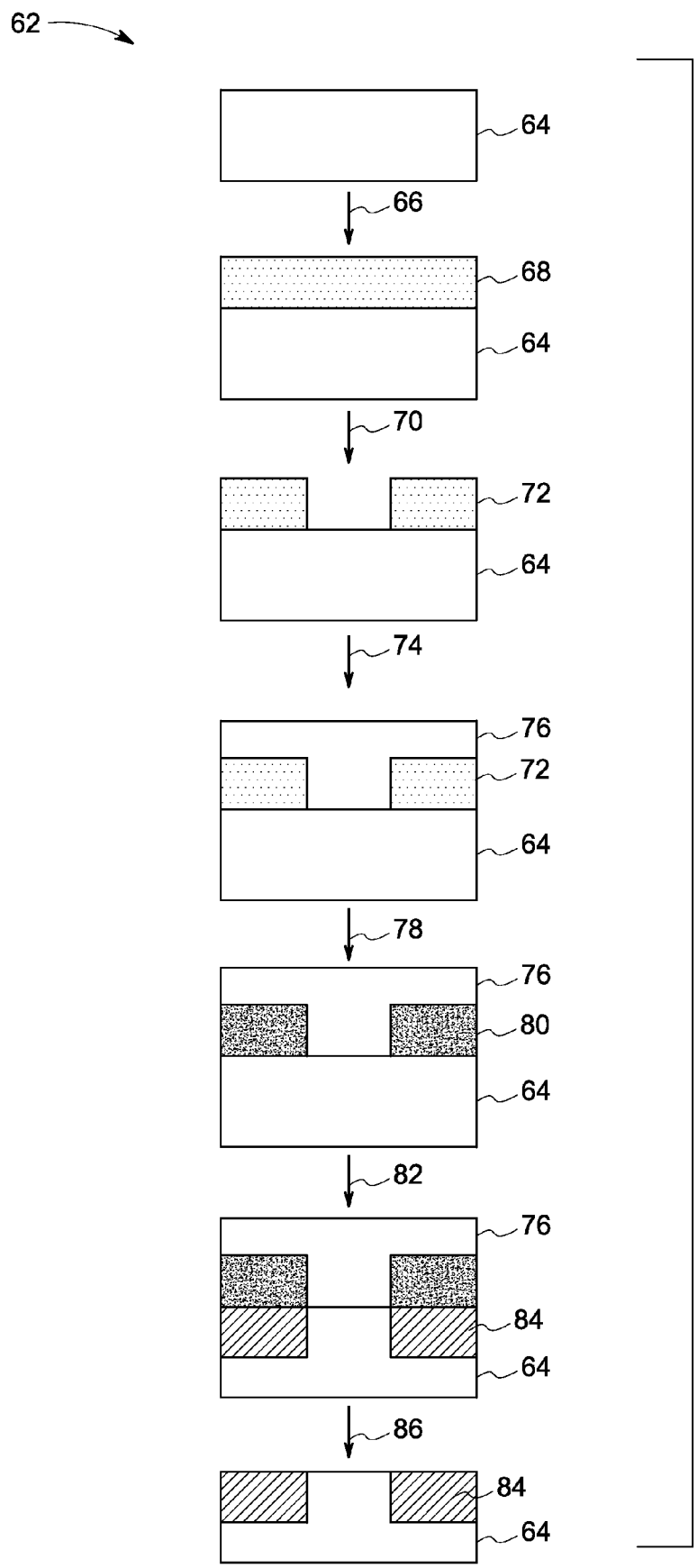
FIG. 5 is a schematic representation of a method for doping impurities into a device layer in accordance with one embodiment of the present invention.

FIG. 5 is a schematic representation of a process for doping impurities in accordance with another embodiment of the present invention. The method 62 includes providing a device layer or substrate 64 and in step 66 disposing a coating 68 of the carbon-based dopant material over the device layer 64. In this embodiment, before the step of carbonizing, the coating 68 is patterned in step 70 to form a patterned coating 72 of the carbon-based dopant material. In step 74, a protective layer of a photoresist material 76 is disposed over the patterned coating 72 of the carbon-based dopant material. The patterned coating 72 of the carbon-based dopant material and the photoresist material 76 are carbonized in step 78. The carbonized dopant layer is heat treated in step 82 to diffuse impurities into the device layer to form impurity doped regions 84. In step 86, the carbonized dopant layer and the protective layer are removed.

Figure 6:
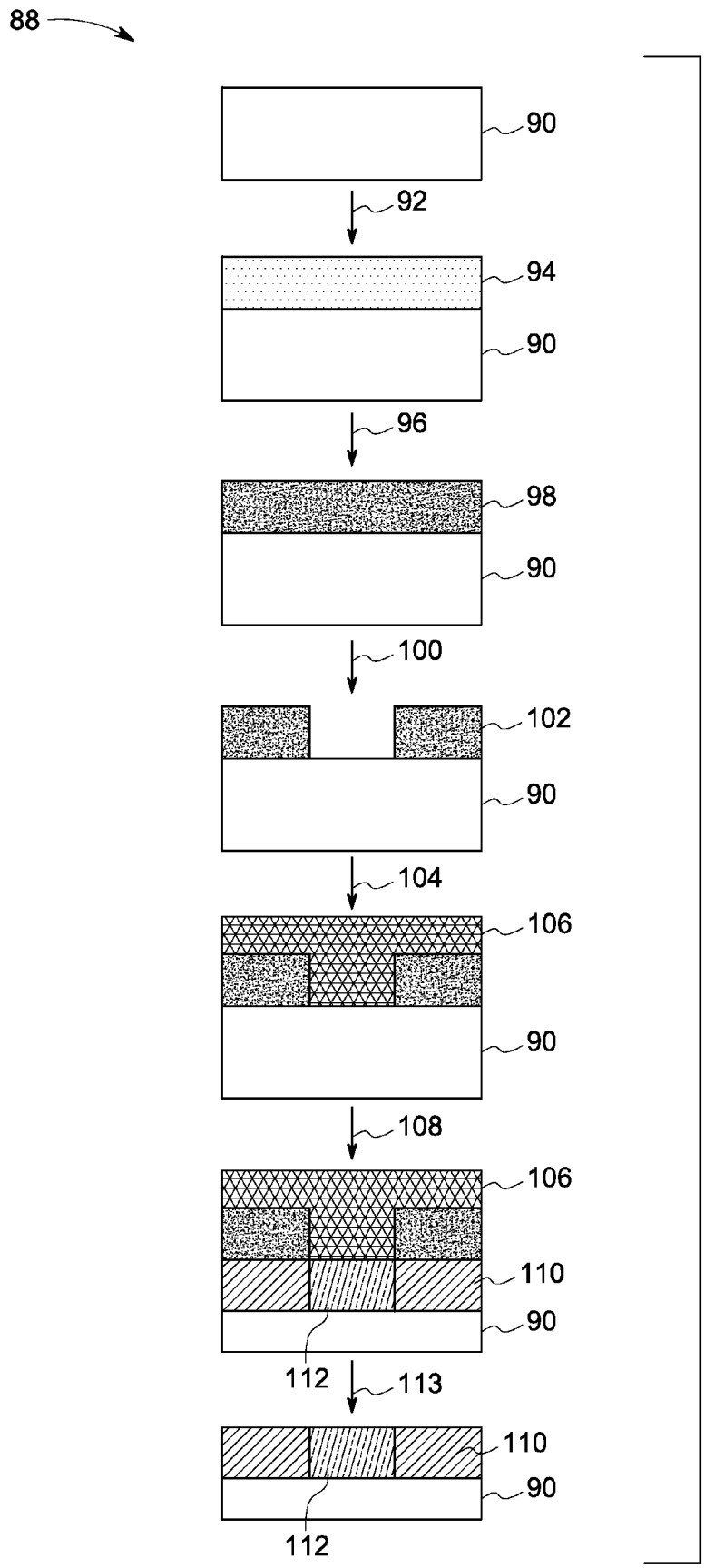
FIG. 6 is a schematic representation of a method for fabricating a device in accordance with one embodiment of the present invention.

FIG. 6 is a schematic representation of a process for fabricating a device, for example a transistor, in accordance with one embodiment of the present invention. The method 88 includes providing a device layer or substrate 90. In step 92, a coating of a first carbon-based dopant material 94 including a first type of impurities is disposed over the device layer 88. In step 96, the first carbon-based dopant material is carbonized to form a carbonized dopant layer 98. In step 100, the first carbonized dopant material is patterned to form a patterned first carbonized dopant layer 102. In step 104 a second carbon-based dopant material including a second type of impurities is deposited over the patterned first carbonized dopant layer and is carbonized to form a second carbonized dopant layer 106. Part of the second carbonized dopant layer 106 is directly in contact with the device layer 90. In step 108, the two dopant layers 102 and 106 are annealed to cause thermal diffusion of a first type of impurities and a second type of impurities into the device layer 90 to form a first dopant type regions 110 and a second dopant type region 112 sandwiched between the first dopant type regions 110 and forming junctions with the first dopant type regions 110 on either side of region 112. In step 114, the two dopant layers 102 and 106 are removed.

In one embodiment, the first dopant type comprises at least one acceptor type dopant (p type) and the second dopant type comprises at least one donor type dopant (n type), such that a p-n-p transistor device structure is formed. In another embodiment, the first dopant type comprises at least one donor type dopant (n type) and the second dopant type comprises at least one acceptor type dopant (p type), such that an n-p-n transistor device structure is formed.

Many semiconductor devices include regions doped differently from adjacent layers or regions. In one example, the method illustrated in FIG. 3 can be used to form a MOSFET device. For example, a MOSFET has source and drain regions in contact with and differently doped from a base layer. If the device layer 30 in FIG. 3 is a P-type base layer, then heavily n-doped source and drain regions 48 can be formed as illustrated in FIG. 3. A gate dielectric layer can be deposited on top of the P-type base layer and a gate electrode and source and drain contacts can be deposited to complete the device. The method can be suitably altered to form many different semiconductor device structures and all such method embodiments fall within the scope of this invention. Non-limiting examples of such devices structures include diodes, transistors, FETs, MOSFETs, JFETs, etc.

Figure 7:
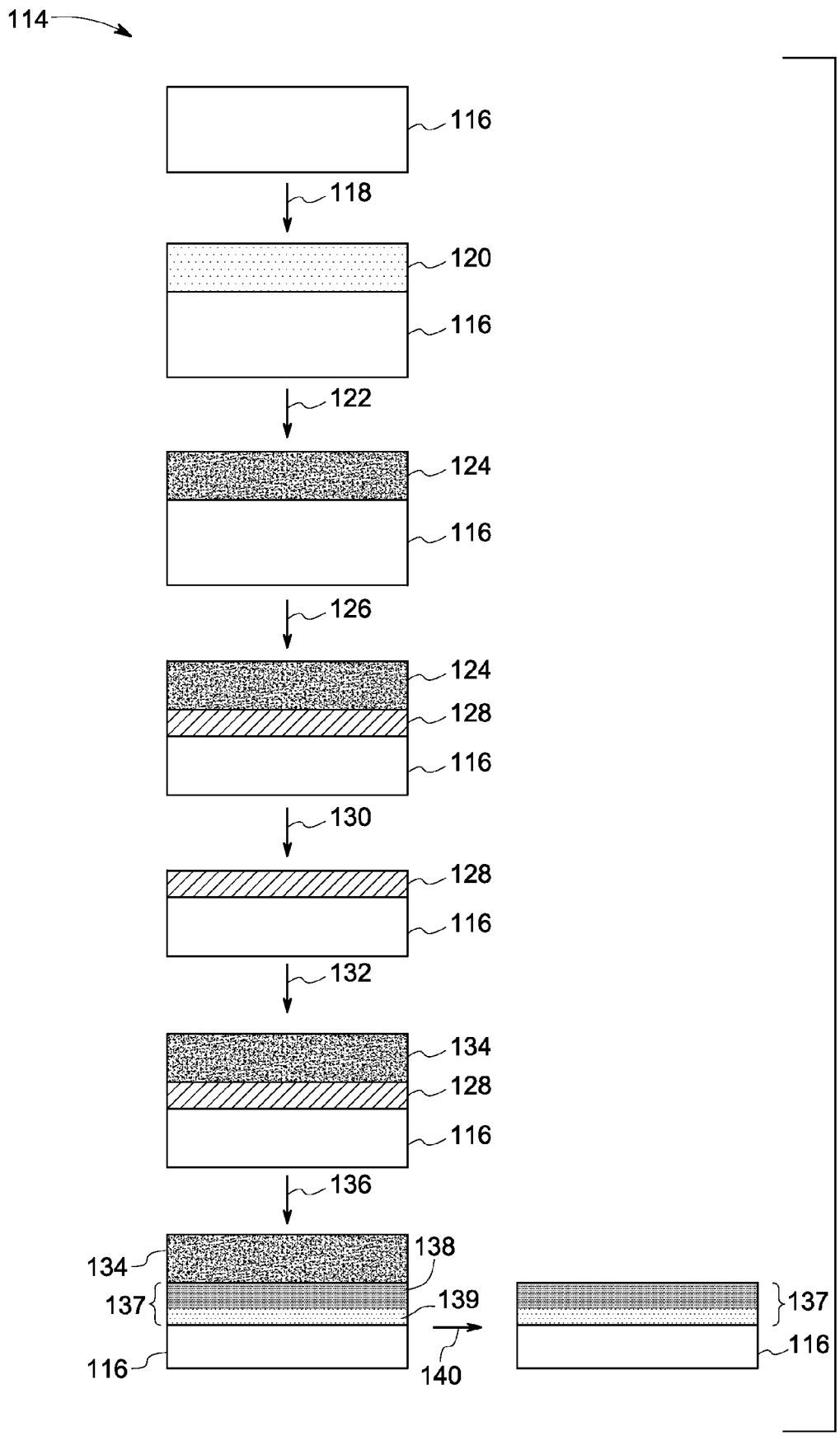
FIG. 7 is a schematic representation of a method for fabricating a device in accordance with one embodiment of the present invention.

FIG. 7 is a schematic representation of a process for forming a device structure, including formation of a graded dopant region in a device layer in accordance with one embodiment of the present invention. The method 114 includes providing a device layer or substrate 116. In step 118 a coating of a first carbon-based dopant material 120 including one or more impurities is disposed over the device layer 116. In step 122, the first carbon-based dopant material is carbonized to form a carbonized dopant layer 124. In step 126 the carbonized dopant layer is heat treated to diffuse impurities in the device layer to form a doped region 128. In step 130, the carbonized dopant layer is removed. In step 132, a second carbon-based dopant material is deposited over the doped region 128 and is carbonized to form a second carbonized dopant layer 134. In one embodiment, a second carbon-based dopant layer includes the same impurities as the first carbon-based dopant layer. In another embodiment, the second carbon-based dopant layer includes impurities different from the first carbon-based dopant layer. In step 136, the second carbonized dopant layer is heat treated to thermally diffuse the impurities of the second carbon-based dopant layer into the previously doped region 128. In addition, the impurities of the first carbon-based dopant layer are driven further in and a gradation in the concentration of the impurities in the device layer results, leading to a graded dopant region 137, having differently doped regions or regions with different dopant concentration 138 and 139. In step 140, the second carbonized dopant layer is removed. As used herein, a graded dopant region or layer refers to a region or layer having a distribution of dopants that is not uniform. For example, the region 137 could have a gradual or continuous change in the dopant concentration from the carbonized dopant layer end to the device layer end. In another example, the graded region 137 could have two or more zones of different dopant concentrations but substantially uniform concentration within the zone. As shown in FIG. 7, the graded dopant region has two zones, 138 and 139, of different dopant concentrations.

In another embodiment, impurities are diffused into a device layer or substrate by heat treating a carbonized dopant layer to form a doped region or layer with a first thickness and a first dopant concentration. Subsequent to the removal of the carbonized dopant layer after heat treatment, an undoped carbonized dopant layer is disposed over the device layer and subjected to heat treatment. This leads to a formation of a modified dopant region or layer with a thickness greater than the first thickness and a dopant concentration lower than the first concentration.

Figure 8:
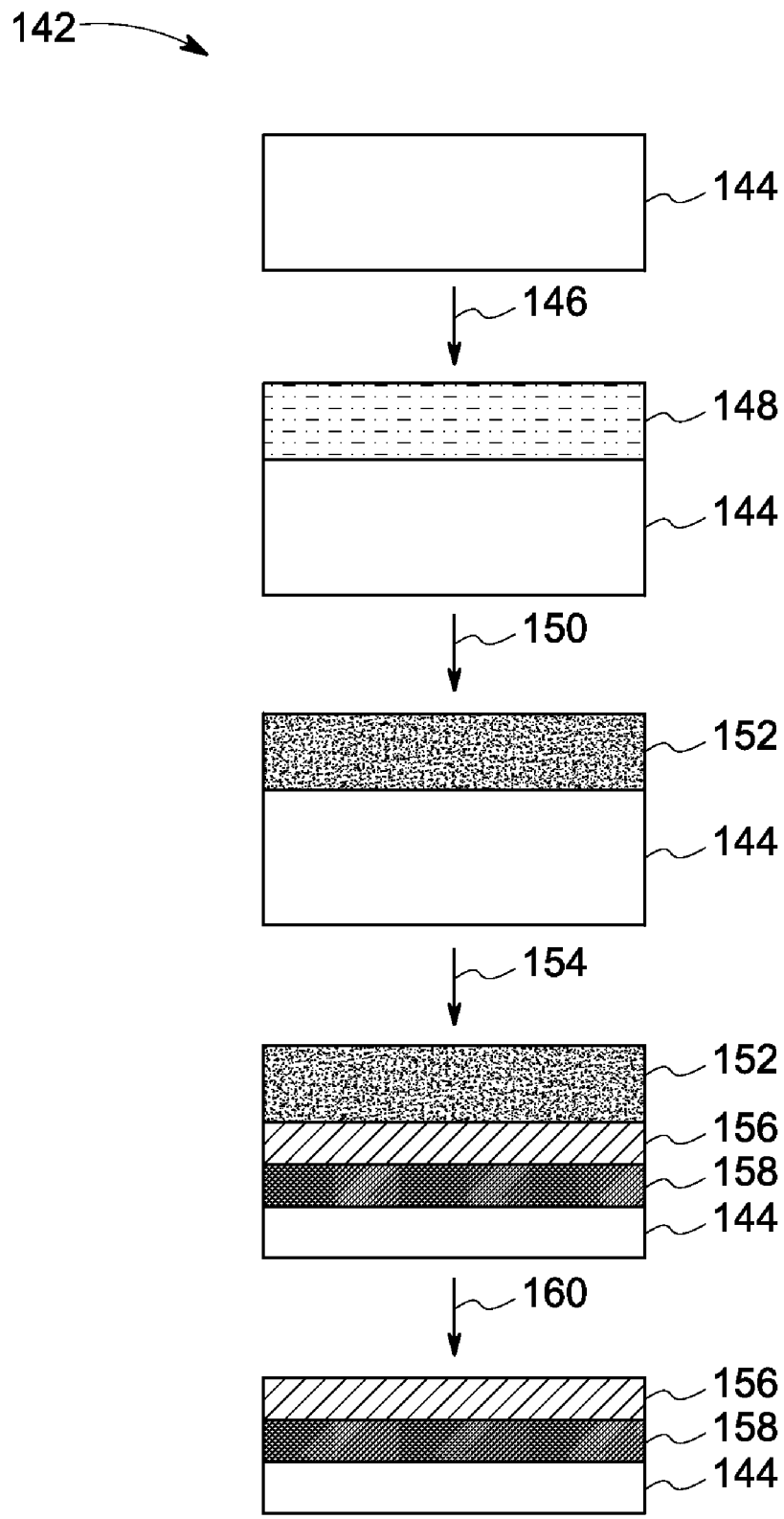
FIG. 8 is a schematic representation of a method for fabricating a device in accordance with one embodiment of the present invention.

In another embodiment of the present invention as shown in FIG. 8, more than one type of dopant impurities may be mixed with a photoresist to form a carbon-based dopant material. In the method 142 shown in FIG. 8, both p type and n-type dopants (for example, boron and phosphorous) may be mixed with the resist and the coating 148 applied to the device layer 144 as illustrated in step 146. The layer is carbonized in step 50. Upon heat treatment 154, the p-type and n-type dopants in the carbonized layer 152 will diffuse at different rates and to different depths of the device layer 144 forming a first region 156 with substantially a first type of dopants and a second region 158 with substantially a second type of dopants. In one embodiment, such differential diffusion will give rise to a p-n junction formation. If the device layer into which the dopants are diffused into is an n-type layer initially for example, and if the p-type dopants diffuse deeper into the device layer than the n-type dopants, upon diffusion of the dopants an n-p-n device structure such as a transistor is formed.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

Example 1

In one example a carbon-based dopant material is prepared by mixing a polymer photoresist (Shipley's AZ1518 or AZ1512) and a significant source of dopant (boron), tri-methyl-borate. The mixture is then evenly coated on a silicon carbide wafer by applying the mixture and spinning the silicon carbide wafer. The silicon carbide wafer coated with a carbon-based dopant layer is then annealed in a non-oxidizing ambient to drive off hydrogen and oxygen, leaving a carbonized dopant layer heavily laden with the boron impurity. The doped layer is patterned using photolithography, or is selectively etched away to accomplish selective area doping. To protect the exposed silicon carbide surface during the high temperature annealing step, the exposed area is then coated with an undoped photoresist. The silicon carbide wafer coated with the doped and patterned carbonized dopant layer is then annealed at a temperature of about, 1800° C. to about 2100° C., during which the impurities diffuse into the SiC wafer. This diffusion of impurities is expected to electrically alter the silicon carbide material in only the areas adjacent to the carbonized dopant layer. On short wave UV light illumination, areas with boron impurity are expected to fluoresce yellow for 6H—SiC or green-yellow for 4H—SiC.

Example 2

In another example, a carbon-based dopant material is prepared by mixing a polymer photoresist (Shipley's AZ1518 or AZ1512) and a significant source of dopant (magnesium), $Mg(OH)_2$. The mixture is then evenly coated on a gallium nitride wafer by applying the mixture and spinning the gallium nitride wafer. The gallium nitride wafer with the carbonized dopant layer is then annealed at temperature of about 1000° C. to about 1500° C., during which the impurities diffuse into the gallium nitride wafer.

Embodiments of the present invention are expected to provide selective doping and high quality surface with little damage to the lattice.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for doping impurities into a device layer comprising:
   providing a carbonized dopant layer over a device layer, wherein the carbonized dopant layer comprises one or more dopant impurities; and
   heat treating the carbonized dopant layer to thermally diffuse the dopant impurities into the device layer, wherein providing a carbonized dopant layer over a device layer comprises vapor depositing or co-sputtering to deposit the carbonized dopant layer, wherein the carbonized dopant layer comprises carbon and one or more dopant impurities.

2. The method of claim 1, wherein heat treating the carbonized dopant layer comprises annealing the carbonized dopant layer.

3. The method of claim 2 wherein annealing comprises annealing at a temperature in a range from about 1000° C. to about 2500° C.

4. The method of claim 1, wherein the one or more impurities comprise n-type dopants, p-type dopants, optical dopants or magnetic dopants.

5. The method of claim 1, wherein the one or more impurities comprise dopants comprising aluminum, boron, gallium, magnesium phosphorus, arsenic, calcium, beryllium, iron, antimony, nitrogen, silicon, or any combination thereof.

6. The method of claim 1, wherein the one or more impurities comprise magnetic dopants comprising manganese, cobalt, iron or any combination thereof.

7. The method of claim 1, wherein the device layer comprises a material comprising Si, AlN, InN, or AlGaN.

8. The method of claim 1, wherein the device layer comprises SiC.

9. The method of claim 1, wherein the device layer comprises GaN.

10. The method of claim 1, further comprising providing a carbonized photoresist layer over the carbonized dopant layer prior to heat treating the carbonized dopant layer to protect the carbonized dopant layer during heat treating.

11. The method of claim 1, wherein the carbonized dopant layer comprises a patterned carbonized dopant layer.

12. The method of claim 1, further comprising removing the carbonized dopant layer after heat treatment.

13. The method of claim 12, wherein removing the carbonized dopant layer comprises burning the carbonized dopant layer in an oxygen environment.

14. A method for doping impurities into a device layer comprising:
   providing a carbonized dopant layer over a device layer, wherein the carbonized dopant layer comprises one or more dopant impurities; and
   heat treating the carbonized dopant layer to thermally diffuse the dopant impurities into the device layer,
   wherein providing a carbonized dopant layer comprises:
   coating a surface of the device layer with a carbon-based material;
   carbonizing the carbon-based material to form a carbonized layer; and
   implanting dopant impurities into the carbonized layer to form the carbonized dopant layer.

15. A method for doping impurities into a device layer comprising:
   providing a carbonized dopant layer over a device layer, wherein the carbonized dopant layer comprises one or more dopant impurities; and
   heat treating the carbonized dopant layer to thermally diffuse the dopant impurities into the device layer,
   wherein providing a carbonized dopant layer comprises:
   coating a substrate with a carbon-based dopant material, wherein the carbon-based dopant material includes one or more impurities;
   carbonizing the carbon-based dopant material to form a carbonized dopant layer;
   removing the carbonized dopant layer from the substrate; and
   disposing the carbonized dopant layer over the device layer.

16. The method of claim 15, further comprising patterning the carbonized dopant layer prior to removing the carbonized dopant layer from the substrate.

17. The method of claim 15, further comprising patterning the carbonized dopant layer by reactive ion etching prior to heat treating the carbonized dopant layer.

18. The method of claim 17, further comprising disposing a nitride layer to protect the carbonized dopant layer during patterning and etching processes.

19. A method for doping impurities into a device layer comprising:
   disposing a photoresist layer over the device layer;
   patterning the photoresist layer;
   disposing a carbon-based dopant material over the patterned photoresist layer, wherein the carbon-based dopant material comprises one or more dopant impurities;
   patterning the carbon-based dopant material;
   carbonizing the carbon-based material to form a carbonized dopant layer; and
   heat treating the carbonized dopant layer to thermally diffuse the dopant impurities into the device layer.

20. The method of claim 19, wherein patterning the carbon-based dopant material comprises performing photolithography of the carbon-based dopant material.

21. The method of claim 19, further comprising disposing a photoresist layer over the carbon-based dopant material subsequent to patterning the carbon-based dopant material and prior to carbonizing the carbon-based dopant material.

* * * * *